United States Patent
Bronson et al.

(10) Patent No.: US 10,170,996 B2
(45) Date of Patent: Jan. 1, 2019

(54) DIODE CONDUCTION SENSOR

(71) Applicant: WITRICITY CORPORATION, Watertown, MA (US)

(72) Inventors: Daniel Bronson, Nibley, UT (US); Conor Joseph Rochford, Boston, MA (US)

(73) Assignee: WITRICITY CORPORATION, Watertown, MA (US)

( * ) Notice: Subject to any disclaimer, the term of this patent is extended or adjusted under 35 U.S.C. 154(b) by 0 days.

(21) Appl. No.: 15/636,984

(22) Filed: Jun. 29, 2017

(65) Prior Publication Data

US 2018/0006566 A1 Jan. 4, 2018

Related U.S. Application Data

(60) Provisional application No. 62/356,817, filed on Jun. 30, 2016.

(51) Int. Cl.
*H02M 1/36* (2007.01)
*H03F 3/217* (2006.01)
(Continued)

(52) U.S. Cl.
CPC .......... *H02M 3/1588* (2013.01); *H01S 5/042* (2013.01); *H02M 1/38* (2013.01); *H03F 3/2176* (2013.01);
(Continued)

(58) Field of Classification Search
CPC .. H02M 1/38; H02M 3/06; H02M 2001/0048; H02M 2001/0051;
(Continued)

(56) References Cited

U.S. PATENT DOCUMENTS

| 5,179,511 A | 1/1993 | Troyk et al. |
| 2005/0088863 A1* | 4/2005 | Pearce ................. G01K 7/01 363/62 |

(Continued)

FOREIGN PATENT DOCUMENTS

| EP | 2 074 694 B1 | 11/2011 |
| EP | 2 985 846 A1 | 2/2016 |
| EP | 3 024 140 A1 | 5/2016 |
| JP | 2008028791 | 2/2008 |
| WO | WO 2013/014521 A1 | 1/2013 |

OTHER PUBLICATIONS

International Search Report & Written opinion of the ISA dated Sep. 25, 2017 from International Application No. PCT/US2017/039874; 15 Pages.

*Primary Examiner* — Alex Torres-Rivera
(74) *Attorney, Agent, or Firm* — Daly, Crowley, Mofford & Durkee, LLP

(57) ABSTRACT

Methods and apparatus for a body diode conduction sensor configured for coupling to a switching element. In embodiments, the sensor comprises first and second voltage divider networks coupled to a voltage source and a diode coupled to the switching element and to the first voltage divider network, wherein the diode is conductive at times corresponding to body diode conduction of the switching element decreasing the DC average voltage at the output node of the first voltage divider network. A differential output voltage can be coupled to the first and second voltage divider networks with an output signal corresponding to a time of the body diode conduction of the switching element.

20 Claims, 10 Drawing Sheets

(51) Int. Cl.
  *H02M 3/158* (2006.01)
  *H01S 5/042* (2006.01)
  *H02M 1/38* (2007.01)
  *H03K 17/16* (2006.01)
  *H02J 50/10* (2016.01)
  *H02M 1/00* (2006.01)

(52) U.S. Cl.
  CPC ............ *H03K 17/165* (2013.01); *H02J 50/10* (2016.02); *H02M 2001/0048* (2013.01)

(58) Field of Classification Search
  CPC .. H02M 2001/0054; H02J 5/005; H02J 50/00; H02J 50/10
  USPC ........................................................ 363/56.04
  See application file for complete search history.

(56) References Cited

U.S. PATENT DOCUMENTS

| | | | |
|---|---|---|---|
| 2006/0226820 A1* | 10/2006 | Farkas | G05F 1/573 |
| | | | 323/276 |
| 2008/0278125 A1* | 11/2008 | Pigott | H02M 1/38 |
| | | | 323/271 |
| 2009/0027024 A1* | 1/2009 | Dequina | H02M 1/38 |
| | | | 323/283 |
| 2012/0267960 A1 | 10/2012 | Low et al. | |
| 2013/0063984 A1* | 3/2013 | Sandner | H02M 1/38 |
| | | | 363/20 |
| 2013/0113299 A1 | 5/2013 | Von Novak et al. | |
| 2014/0132356 A1 | 5/2014 | Onizuka et al. | |
| 2015/0280444 A1 | 10/2015 | Smith et al. | |
| 2016/0294298 A1* | 10/2016 | Wong | H02M 3/33592 |
| 2017/0222569 A1* | 8/2017 | Choi | H02M 1/088 |

* cited by examiner

DIODE CONDUCTION SENSOR

CROSS REFERENCE TO RELATED APPLICATIONS

The present application claims the benefit of U.S. Provisional Patent Application No. 62/356,817, filed on Jun. 30, 2016, entitled: "Conduction Sensor", which is incorporated herein by reference.

BACKGROUND

There are a variety of types of amplifiers/converters that may be used in various applications based upon operating characteristics. For example, class E amplifiers have certain advantages and disadvantages. One disadvantage of class E amplifiers is that operating at higher frequencies and driving excessively inductive load impedances may cause body diode conduction loss. In order to decrease the body diode conduction loss when a class E amplifier drives a varying inductive impedance, the duty cycle of the switch driving the class E amplifier can be varied in order to control the switching waveform and to achieve zero voltage switching. Conventional feedback mechanisms for class E amplifiers monitor input power to the class E amplifier and adjust the duty cycle in order to increase or decrease the power delivered to the class E amplifier. However, without perfect output power regulation, power dissipation and input power may not have a direct relationship so that duty cycle adjustments based solely on input power may not have the desired effect with respect to dissipated power and amplifier efficiency.

SUMMARY

Power transfer systems may rely on electronic circuits such as rectifiers, AC (Alternating Current) to DC (Direct Current) converters, impedance matching circuits, and other power electronics to condition, monitor, maintain, and/or modify the characteristics of the voltage and/or current used to provide power to electronic devices. Power electronics can provide power to a load with dynamic impedance characteristics.

In some applications, such as wireless power transfer, load impedances for a wireless power apparatus may vary dynamically. In such applications, for example, impedance matching between a load, such as a resonator coil, and a power supply of the apparatus may be used to mitigate unnecessary energy losses and excess heat. It is understood that the impedance matching network can be used to transform the coil impedance in series with the reflected load impedance. The input impedance of the impedance matching network, which loads the amplifier, may have the highest possible magnitude while maintaining the minimum inductive reactive current possible for the amplifier to achieve zero voltage switching at a given duty cycle. Variation in the coil impedance and reflected load impedance may shift the input impedance of the impedance matching network. This changes the magnitude of the inductive reactive current into the impedance matching network, which causes the zero voltage transition across the switching element to occur at different times within the period. The duty cycle of the switching element can be increased or decreased to turn on the switching element at the same time or close to the same time as the zero voltage transition for a given input impedance of the impedance matching network. This ensures minimum body diode conduction and hard switching for a given input impedance. In addition, power transfer systems transferring and/or receiving power via highly resonant wireless energy transfer, for example, may also configure or modify impedance matching networks to maintain efficient power transfer. Thus, in some cases, in order to enable efficient power transfer, a dynamic impedance matching network is provided.

In embodiments, a wireless power transfer system can include a feedback mechanism having a body diode conduction sensor for a switching element of an amplifier that can enable duty cycle adjustment of the switching element to promote efficient operation. In embodiments, the feedback mechanism can include a diode conduction sensor to provide feedback to a controller, such as a microprocessor, to control an amount of time an internal diode of an amplifier switching element is conducting current. The feedback can enable a microcontroller, for example, to attempt to minimize time spent in diode conduction of the power switching element for reducing the power loss in the switch and increasing efficiency. For example, for a passive impedance shift of −60 jOhm, an illustrative body conduction sensor may save 3.5 W of power on the FETs. Without such a power reduction realized by a body diode conduction sensor, amplifier FETs may overheat without duty cycle adjustment. In embodiments, the microcontroller can adjust a duty cycle of the amplifier/converter to achieve desired waveform and switching characteristics.

In embodiments, a diode conduction sensor includes components configured to achieve a relatively low insertion loss at a relatively low cost. Illustrative embodiments of a diode conduction sensor are compatible with many types of switching schemes in order to determine when the power device is conducting through its body diode. While shown and described in conjunction with class E amplifiers, it is understood that embodiments can be applicable to various classes of amplifiers and synchronous rectification in general.

In one aspect, a system comprises: a body diode conduction sensor configured for coupling to a switching element, the sensor comprising: first and second voltage divider networks coupled to a voltage source; a diode coupled to the switching element and to the first voltage divider network, wherein the diode is conductive at times corresponding to body diode conduction of the switching element decreasing the DC average voltage at the output node of the first voltage divider network; and an output for a differential output voltage coupled to the first and second voltage divider networks having an output signal corresponding to a time of the body diode conduction of the switching element.

A system can further include one or more of the following features: a shunt capacitor coupled across the switching element, a duty cycle of the switching element is adjusted based upon the body diode conduction of the switching element, the switching element forms a part of a class E amplifier, the sensor comprises a part of a power transmitter to transmit wireless power to a power receiver, the power transmitter comprises a resonant wireless power transmitter, and/or the power transmitter includes an impedance matching network driven by the switching element.

In another aspect, a method comprises: providing a body diode conduction sensor configured for coupling to a switching element by: coupling first and second voltage divider networks to a voltage source; coupling a diode to the switching element and to the first voltage divider network, wherein the diode is conductive at times corresponding to body diode conduction of the switching element decreasing the DC average voltage at the output node of the first voltage divider network; and coupling an output for a differential output voltage to the first and second voltage divider networks having an output signal corresponding to a time of the body diode conduction of the switching element.

A method can further include one or more of the following features: coupling a shunt capacitor across the switching element, a duty cycle of the switching element is adjusted based upon the body diode conduction of the switching element, the switching element forms a part of a class E amplifier, the sensor comprises a part of a power transmitter to transmit wireless power to a power receiver, the power transmitter comprises a resonant wireless power transmitter, and/or the power transmitter includes an impedance matching network driven by the switching element.

In another aspect, a body diode conduction sensor comprises: a divider means for dividing voltage coupled to a voltage source; a diode coupled to a switching means and to the divider means, wherein the diode is conductive at times corresponding to body diode conduction of the switching means decreasing the DC average voltage at the output node of the first voltage divider network; and a differential output voltage means coupled to the divider means, the different output voltage means having an output signal corresponding to a time of the body diode conduction of the switching element.

A body diode conduction sensor can further include one or more of the following features: a shunt element coupled across the switching means, a duty cycle of the switching means is adjusted based upon the body diode conduction of the switching means, the switching means forms a part of a class E amplifier, the sensor comprises a part of a power transmitter to transmit wireless power to a power receiver, and/or the power transmitter comprises a resonant wireless power transmitter.

BRIEF DESCRIPTION OF THE DRAWINGS

The foregoing features of this invention, as well as the invention itself, may be more fully understood from the following description of the drawings in which.

DETAILED DESCRIPTION

This disclosure provides embodiments for a wireless power transfer system having a body diode conduction sensor for a switching element that provides a feedback mechanism to enable duty cycle adjustment for promoting efficient circuit operation. In embodiments, a receiver placed near or on a power transmitter, for example, can alter the impedance of a source resonator and impact characteristics, such as power dissipation, of switching devices that energize the resonator. In illustrative embodiments, a class E amplifier drives an impedance matching network of the source. In embodiments, the impedance network is designed for a particular amplifier and/or resonator. It is desirable to minimize body diode conduction time of switching devices in the amplifier and promote desirable operating characteristics, such as avoiding hard switching.

Figure 1:
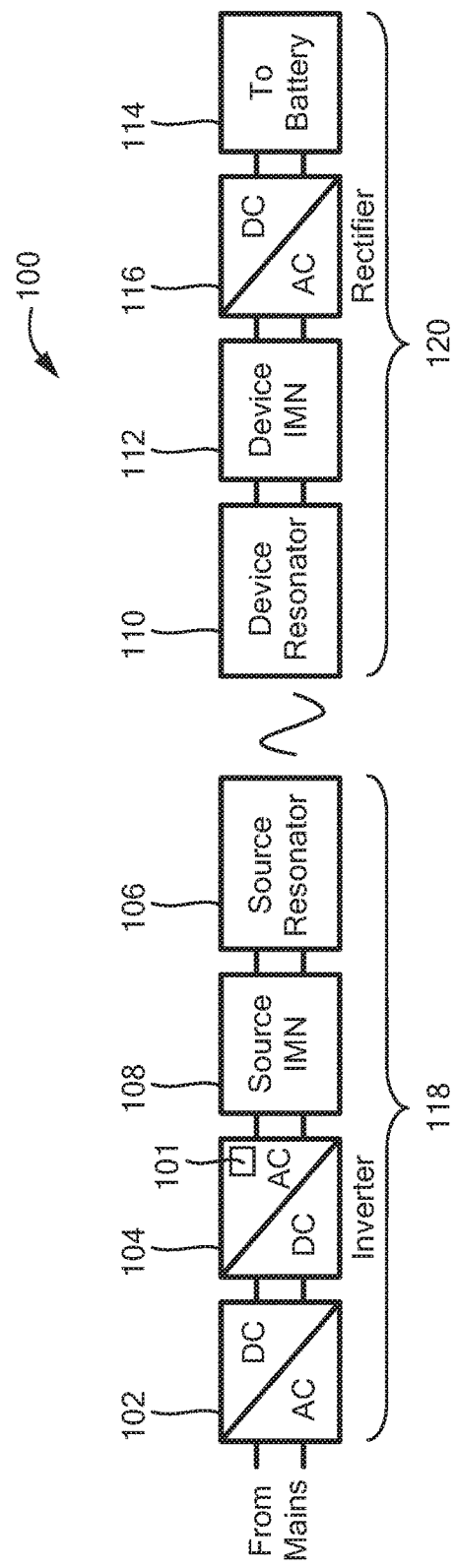
FIG. 1 is a schematic representation of a wireless energy transfer system having a body diode conduction sensor.

FIG. 1 shows a high level functional block diagram of an exemplary embodiment of a wireless power transfer system 100 having a diode conduction sensor 101 for a power switching element. Input power to the system can be provided by wall power (AC mains), for example, which is converted to DC in an AC/DC converter block 102. Alternatively, a DC voltage can be provided directly from a battery or other DC supply. In embodiments, the AC/DC converter block 102 may be a power factor correction (PFC) stage. The PFC, in addition to converting the AC input (for example, at 50 or 60 Hz) to DC, can condition the current such that the current is substantially in phase with the voltage. A high efficiency switching inverter or amplifier 104 converts the DC voltage into an AC voltage waveform used to drive a source resonator 106. In embodiments, the frequency of the AC voltage waveform may be in the range of 80 to 90 kHz. In embodiments, the frequency of the AC voltage waveform may be in the range of 10 kHz to 15 MHz. In one particular embodiment, the frequency of the AC voltage waveform is about 6.78 MHz that may vary within a 15 kHz band due to FCC and CISPR regulations, for example. A source (transmitter) impedance matching network (IMN) 108 efficiently couples the inverter 104 output to the source resonator 106 and can enable efficient switching-amplifier operation. Class D or E switching amplifiers are suitable in many applications and can require an inductive load impedance for highest efficiency. The source IMN 108 transforms the source resonator impedance into such an impedance for the inverter 104. The source resonator impedance can be, for example, loaded by the coupling to a device (receiver) resonator 110 and/or output load. The magnetic field generated by the source resonator 106 couples to the device resonator 110, thereby inducing a voltage. This energy is coupled out of the device resonator 110 to, for example, directly power a load or charge a battery. A device impedance matching network (IMN) 112 can be used to efficiently couple energy from the device resonator 110 to a load 114 and optimize power transfer between source resonator 106 and device resonator 110. It may transform the actual load impedance into an effective load impedance seen by the device resonator 110 which more closely matches the loading for optimum efficiency. For loads requiring a DC voltage, a rectifier 116 converts the received AC power into DC. In embodiments, the source 118 and device (receiver) 120 can further include filters, sensors, and other components.

The impedance matching networks (IMNs) 108, 112 can be designed to maximize the power delivered to the load 114 at a desired frequency (e.g., 80-90 kHz, 100-200 kHz, 6.78 MHz) or to maximize power transfer efficiency. The impedance matching components in the IMNs 108, 112 can be chosen and connected so as to preserve a high-quality factor (Q) value of resonators 106, 110. Depending on the operating conditions, the components in the IMNs 108, 112 can be tuned to control the power delivered from the power supply to the load 114, for example, to maximize efficient wireless transfer of power. It is understood that tuning IMN 112 can directly affect the power delivered from the power supply to the load 114. Tuning capacitor C1s in IMN 108 may indirectly affect the power delivered from the power supply to the load 114.

The IMNs' (108, 112) components can include, for example, a capacitor or networks of capacitors, an inductor or networks of inductors, or various combinations of capacitors, inductors, diodes, switches, and resistors. The components of the IMNs can be adjustable and/or variable and can be controlled to affect the efficiency and operating point of the system. Impedance matching can be performed by varying capacitance, varying inductance, controlling the connection point of the resonator, adjusting the permeability of a magnetic material, controlling a bias field, adjusting the frequency of excitation, and the like. The impedance matching can use or include any number or combination of varactors, varactor arrays, switched elements, capacitor banks, switched and tunable elements, reverse bias diodes, air gap capacitors, compression capacitors, barium zirconium titanate (BZT) electrically tuned capacitors, microelectromechanical systems (MEMS)-tunable capacitors, voltage variable dielectrics, transformer coupled tuning circuits, and the like. The variable components can be mechanically tuned, thermally tuned, electrically tuned, piezo-electrically tuned, and the like. Elements of the impedance matching can be silicon devices, gallium nitride devices, silicon carbide devices, and the like. The elements can be chosen to withstand high currents, high voltages, high powers, or any combination of current, voltage, and power. The elements can be chosen to be high-Q elements.

The IMNs 108, 112 and/or control circuitry monitors system parameters such as source resonator impedance 106 or DC voltage out of rectifier 116 and provides control signals to tune the IMNs 108, 112 or components thereof. In some implementations, the IMNs 108, 112 can include a fixed IMN and a dynamic IMN. For example, a fixed IMN may provide impedance matching between portions of the system with static impedances or to grossly tune a circuit to a known dynamic impedance range. In some implementations, a dynamic IMN can be further composed of a coarsely adjustable components and/or a finely adjustable components. For example, the coarsely adjustable components can permit coarse impedance adjustments within a dynamic impedance range whereas the finely adjustable components can be used to fine tune the overall impedance of the IMN(s). In another example, the coarsely adjustable components can attain impedance matching within a desirable impedance range and the finely adjustable components can achieve a more precise impedance around a target within the desirable impedance range.

Figure 2:
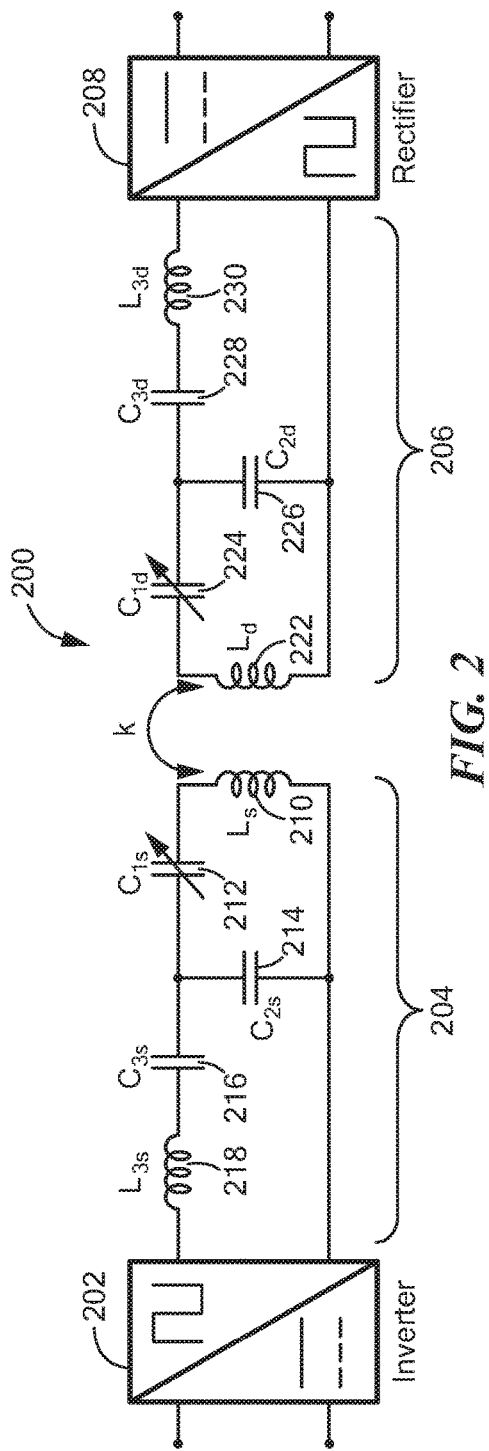
FIG. 2 is a schematic circuit representation of wireless energy transfer system including an illustrative impedance matching network (IMN) having feedback.

FIG. 2 shows an exemplary embodiment of a wireless power transmission system 200 having an inverter 202 powering source or transmitter-side circuit (which includes source resonator and source IMN) 204, which couples, with coupling factor k, oscillating electromagnetic energy to the device or receiver-side circuit (which includes device resonator and device IMN) 206. Embodiments can include a body diode conductor sensor 207 coupled to amplifier switching elements to minimize body diode conduction time. In some embodiments voltage regulation in the power receiver is achieved through a relatively slow BLE (Bluetooth low energy) loop that instructs the power transmitter to adjust its resonators field strength by varying the DC bus voltage driving the amplifier. The oscillating energy is then converted by the rectifier 208. The source-side circuit 204 components include source resonator coil $L_s$ 210, series capacitor $C_{1s}$ 212 (in position 1), parallel capacitor $C_{2s}$ 214 (in position 2), and capacitor $C_{3s}$ 216 and inductor $L_{3s}$ 218 (in position 3). In the illustrative embodiment, capacitor $C_{1s}$ 216 can include one or more variable capacitors. Note that each of the components listed may represent networks or groups of components and that components in at least positions 1 and 3 can be balanced. The device-side circuit 206 components can include device resonator coil $L_d$ 222, series capacitor $C_{1d}$ 224 (in position 1), parallel capacitor $C_{2d}$ 226 (in position 2), and capacitor $C_{3d}$ 228 and inductor $L_{3d}$ 230 (in position 3). The capacitor $C_{1d}$ 224 can include one or more variable capacitors, such as a PWM capacitor, switched bank of capacitors, and varactors. The one or more variable capacitors can be discretely or continuously tunable capacitors. The variable capacitors 216, 228 can promote efficient wireless energy transfer. It is understood that one or more of capacitor $C_{1s}$ 212 (in position 1), parallel capacitor $C_{2s}$ 214 (in position 2), and capacitor $C_{3s}$ 216 can include one or more variable capacitors to meet the needs of a particular application. Similarly, any of device side capacitor $C_{1d}$ 224 (in position 1), parallel capacitor $C_{2d}$ 226 (in position 2), and capacitor $C_{3d}$ 228 can include variable capacitors. It is understood that some embodiments may not include any variable capacitors.

It is understood that the source and/or device impedance matching networks (IMNs) can have a wide range of circuit implementations with various components having impedances to meet the needs of a particular application. U.S. Pat. No. 8,461,719 to Kesler et al., which is incorporated herein by reference, discloses a variety of tunable impedance networks, such as in FIGS. 28a-37b, for example. It is further understood that any practical number of switched and/or tunable capacitors can be used on the source and/or device side to provide desired operating characteristics. In addition, while illustrative embodiments are shown and described in conjunction with highly resonant wireless energy transfer systems, it is understood that body diode conduction sensors are applicable to a wide range of applications in which it is desirable to minimize diode conduction times while maintaining zero voltage switching.

Figure 3:
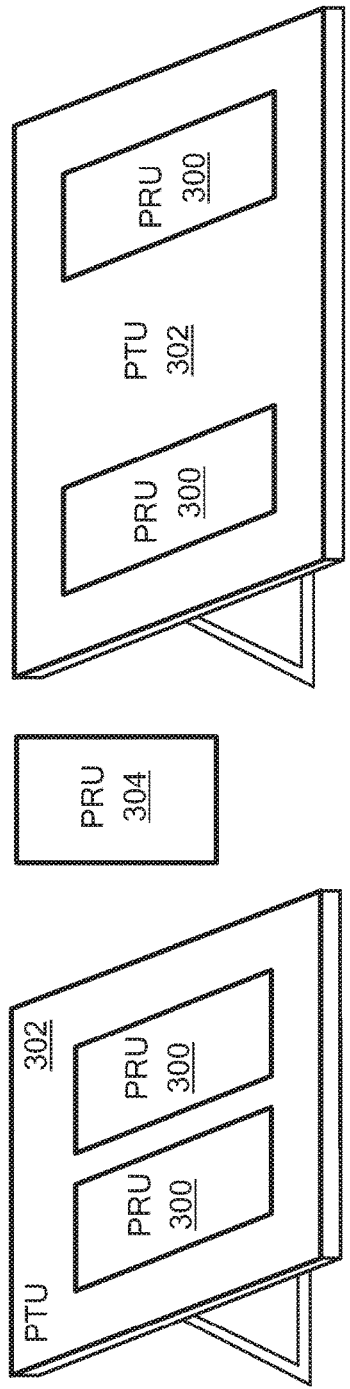
FIG. 3 is a schematic representation of power receivers and power transmitters.

FIG. 3 shows various PRUs 300 on charging platforms of PTUs 302, as well a nearby PRU 304. In embodiments, a power transmitting unit (PTU) interacts with a power receiving unit (PRU) via an in-band channel and an out-of-band channel. As used herein, in-band refers to power transmission channel between the PTU 302 and PRU 300. As a PRU 300 is placed on or around a PTU 302, load impedance can be impacted. As described more fully below, feedback from a diode conduction sensor can be used to promote efficient amplifier operating characteristics as the impedance presented to the amplifier changes.

In embodiments, the PTU 300 can modulate the transmitted wireless energy to communicate with the PRU 302 and the PRU can modify certain characteristics, such as impedance, to communicate with the PTU. As used herein, out-of-band refers to wireless communication between a PTU 302 and PRU 300 via a wireless protocol, such as Bluetooth®. It is understood that any suitable wireless communication technology, protocol, etc., can be used to enable PTUs and PRUs to communicate with each other. It is understood that the terms in-band and out-of-band are used for convenience and should not be used to limit the claimed invention in any way.

Figure 4A:
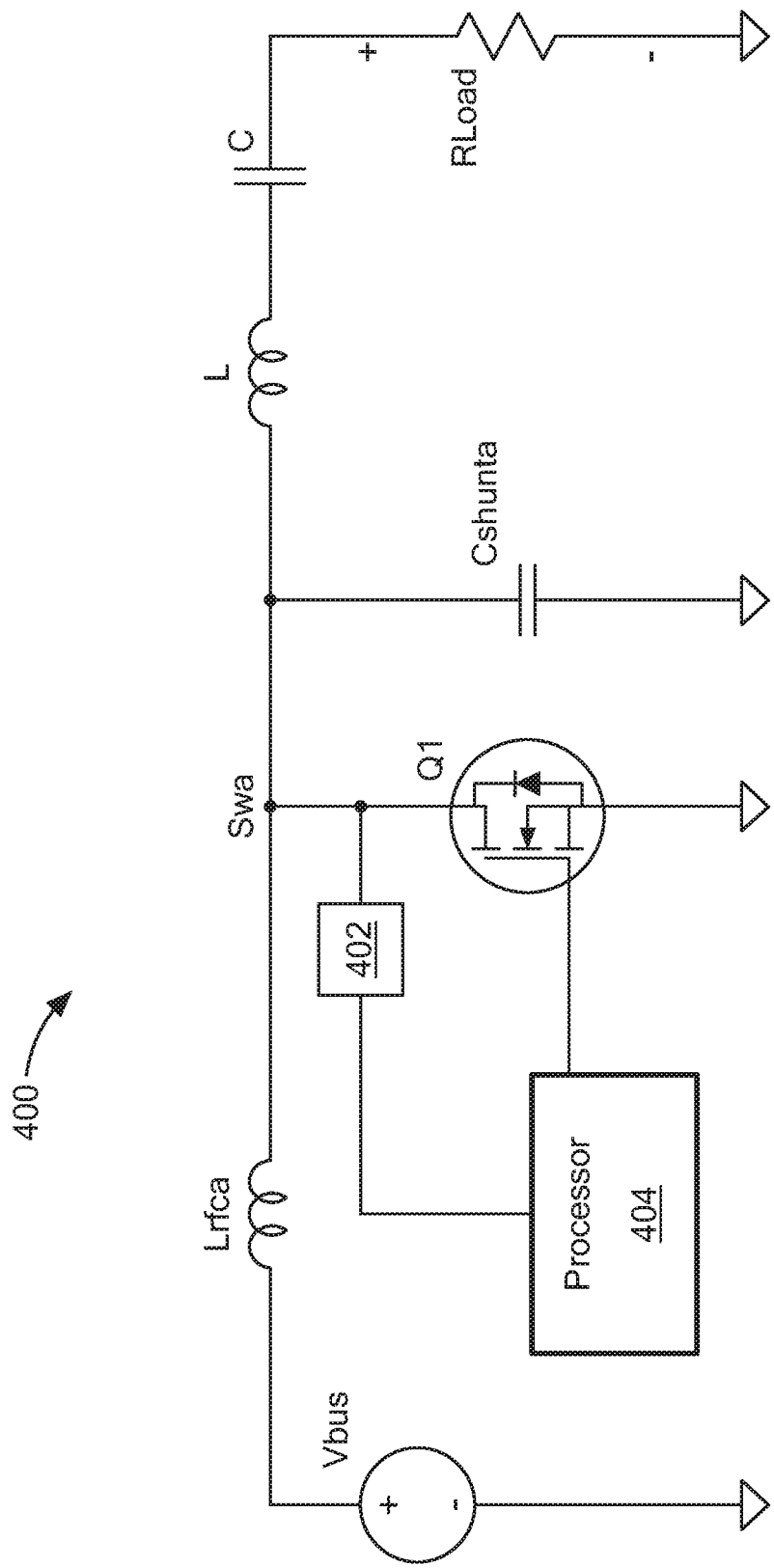
FIG. 4A is a circuit diagram of an amplifier coupled to a diode conduction sensor that can provide feedback to a processor to enable duty cycle adjustment.
Figure 4B:
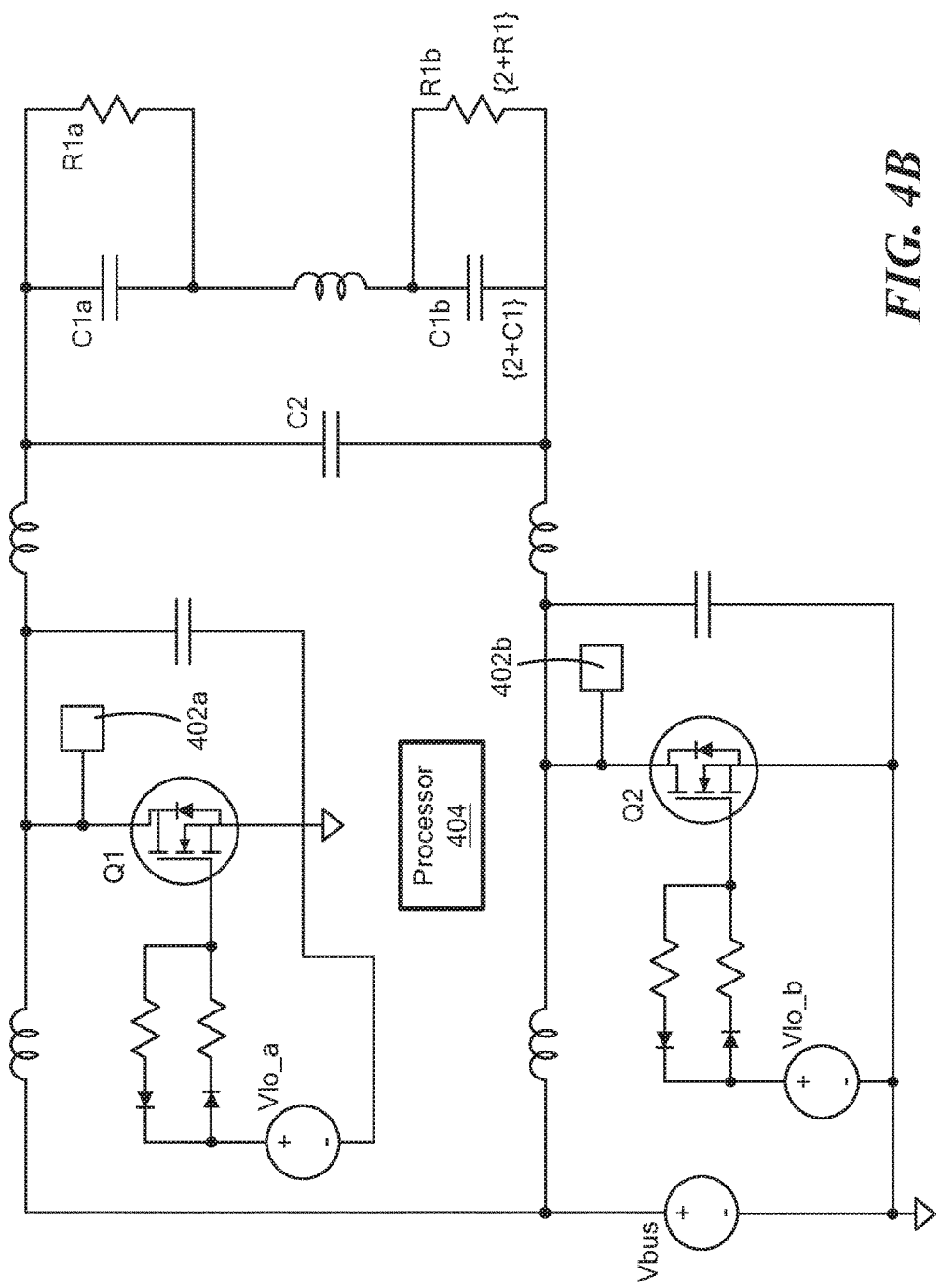
FIG. 4B is a circuit diagram of an example implementation with multiple active switches in an amplifier having body diode conduction sensors.

FIG. 4A shows an example class E amplifier 400 having a body diode conduction sensor 402 coupled to a switching element $Q_1$ of the amplifier and to a processor 404. Energy source $V_{bus}$ is coupled in series with inductor $L_{RFC_a}$ (RF choke), which is coupled to node $Sw_a$. The switching element $Q_1$ is coupled between node $Sw_a$ and ground. A shunt capacitor $C_{shunt_a}$ is coupled across the switching element $Q_1$. From node $Sw_a$, capacitor C and inductor L and load $R_{load}$ are coupled in series. In embodiments, the series RLC models an impedance at 6.78 MHz equal to the input impedance of the impedance matching network with harmonic rejection equal to that of the input of the impedance matching network. FIG. 4B shows an illustrative push-pull amplifier configuration having respective switching elements $Q_1$, $Q_2$ with corresponding body diode conduction sensors 402a,b coupled to the processor 404.

Figure 5:
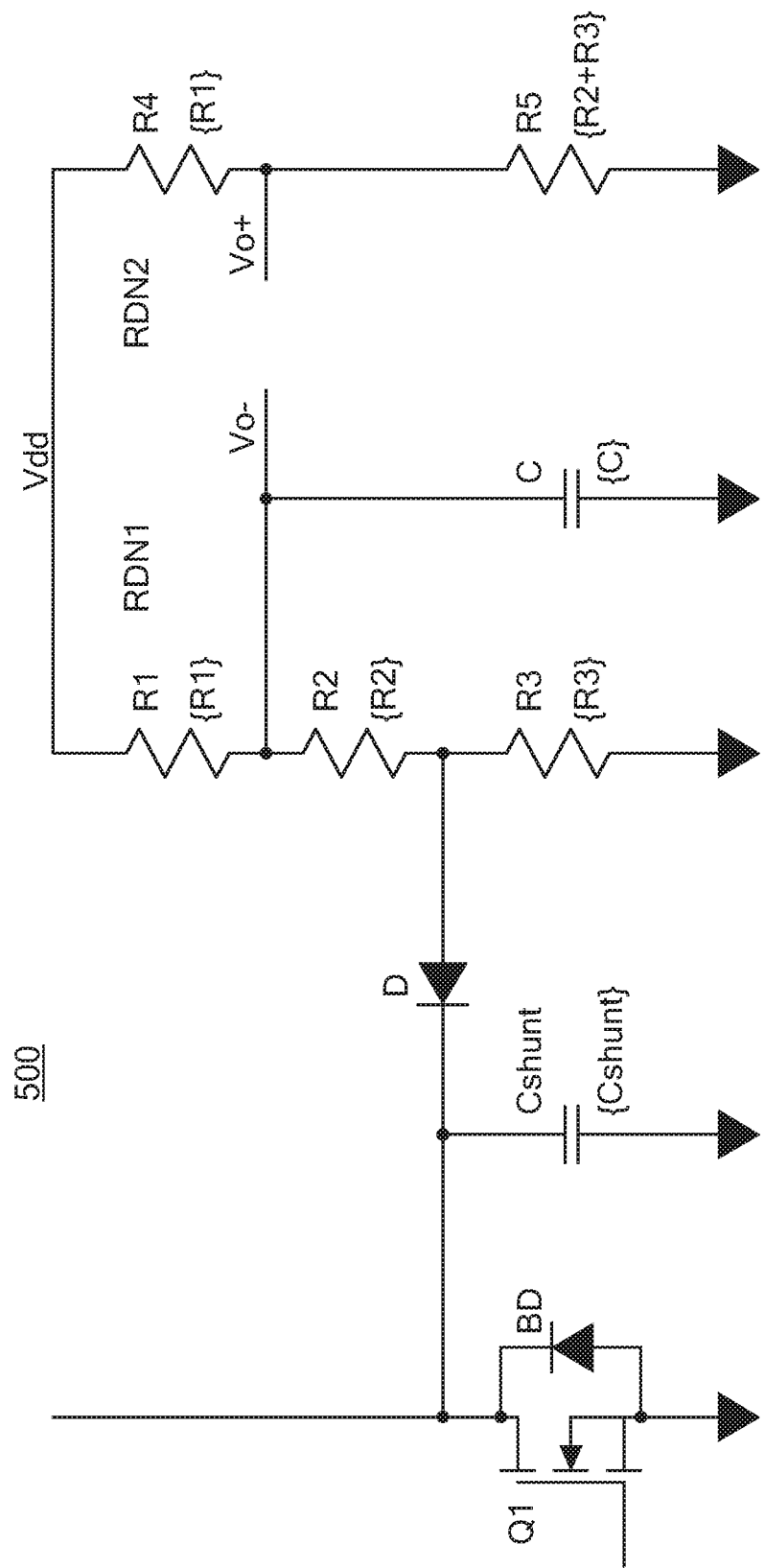
FIG. 5 is a circuit diagram of an example body diode conduction sensor.

FIG. 5 shows an example embodiment of a diode conduction sensor 500 coupled to a power switching element $Q_1$, which is shown as the power switching element of a class E amplifier. A first capacitor $C_{shunt}$ is coupled across the switching element $Q_1$. A voltage $V_{dd}$ is coupled to first and second resistive divider networks $RDN_1$, $RDN_2$. The first resistive divider network $RDN_1$ comprises $R_1$, $R_2$, and $R_3$ and the second resistive divider network $RDN_2$ comprises $R_3$ and $R_5$. A second capacitor C is coupled across $R_2$ and $R_1$ and a diode D is coupled between the $R_2/R_3$ node and the switching element $Q_1$. In one particular embodiment, $R_2+R_3=R_5=221\Omega$ and $R_1=R_4=1$ k$\Omega$ and $V_{dd}$ is 3.3V. A differential pair is coupled between the $R_4/R_5$ node and the $R_1/R_2$ node. It will be appreciated that with this arrangement a differential signal in the form of a positive voltage can be provided to a processor, such as a microcontroller that may generate gate control signals to the switching element for adjusting duty cycle of $Q_1$.

In embodiments, the sensor 500 can provide feedback to determine how much time the amplifier/converter spends conducting current through the body diode of the switching element $Q_1$. By placing the sensor 500 in parallel with the switching element $Q_1$, as the current flows through the body diode of the switching element $Q_1$, the switching node voltage is lower than the ground reference, and a smaller current also flows through $R_2$ and D. As the smaller current flows though the diode D, the voltage across $R_3$ will equal the forward drop across D minus the forward drop across the body diode. This will cause the voltage at the node between $R_1$ and $R_2$, $V_{o-}$ to decrease. In the illustrated embodiment, when there is no body diode conduction, the $R_1/R_2$ and $R_4/R_5$ voltages are substantially similar. Diode D blocks voltage and there is no negative voltage present on the drain to source of the switching element $Q_1$. When there is body diode conduction, the $R_2/R_3$ voltage is clamped to a value defined by the voltage drops across the D and the body diode. In one particular embodiment, the diode D voltage drop is 1V and the body diode drop is about 2.5V for a clamp voltage of about −1.5V (1-2.5). While there is increased body diode conduction, there is increased duration that the $R_2/R_3$ voltage is clamped to −1.5V and the DC average voltage on capacitor C continues to decrease. That is, longer times of body diode conduction correspond to lower voltages on C. The differential voltage of $R_1/R_2$ and $R_4/R_5$ can be provided to a processor as a positive voltage corresponding to an amount of body diode conduction time.

The capacitor C can smooth out the voltage at the $R_1/R_2$ node. Without the capacitor C, the voltage drop information may only occur during the actual diode conduction time. With the capacitor C present, the pulsed waveform at $R_1/R_2$ from the voltage drop due to the diode conduction is averaged by capacitor C. In general, the values of the resistors are set in order to optimize maximize the differential voltage between $V_{o-}$ and $V_{o+}$ as a function of body diode conduction time.

The voltage measured at node $R_1/R_2$ indicates how much time the switching element spends in a body diode conduction state. The $R_1/R_2$ voltage is referenced to the 'nominal' voltage that would be on the node if there were no diode conduction. That 'nominal' voltage is created as a reference by $R_4$ and R as $R_1=R_4$ and $k=R_2+R_3$.

In embodiments, the $R_1/R_2$ voltage is provided to a computer processor that senses the voltage as a differential between the reference voltage $R_4/R_5$ node and the $R_1/R_2$ node. If there is a differential voltage, it indicates that the diode in the switching element $Q_1$ is conducting for a fraction of the switching period that is correlated to the differential voltage. If there is no voltage difference between the two nodes, it indicates that the switching element $Q_1$ is not conducting any current through its body diode.

As noted above, by placing the sensor in parallel with the switch, as the current flows through the switching element $Q_1$ body diode, the switching node voltage will be lower than the ground reference. This will cause a smaller current to flow through $R_2$ and D. As the smaller current flows though the diode D, the voltage from the top of $R_3$ to ground can be described by the D voltage drop ($V_f$) minus the body diode voltage drop $V_{sd}$. Performing Kirchoff's Current Law nodal analysis on the $V_{o-}$ node yields:

$$sCv_{o\_1}(s) - Cv_{o\_2}(0) + \frac{v_{o\_1}(s) + (V_{sd} - V_f)}{R_2} + \frac{v_{o\_1}(s) - V_{dd}}{R_1} = 0$$

Where $v_{o\_1}(s)$ the Laplace domain is function of voltage at $V_{o-}$ and $v_{o\_2}(0)$ is the initial condition of $V_{o-}$ as the body diode transitions from turning off to turning on. Solving for $v_{o\_1}(s)$ yields:

$$v_{o\_1}(s) = \frac{v_{o\_2}(0)}{s + \left(\frac{R_1 + R_2}{R_1 R_2 C}\right)} -$$

$$\frac{(V_{sd} - V_f)\left(\frac{R_1}{R_1 + R_2}\right)\left(\frac{R_1 + R_2}{R_1 R_2 C}\right)}{s + \left(\frac{R_1 + R_2}{R_1 R_2 C}\right)} + \frac{V_{dd}\left(\frac{R_2}{R_1 + R_2}\right)\left(\frac{R_1 + R_2}{R_1 R_2 C}\right)}{s + \left(\frac{R_1 + R_2}{R_1 R_2 C}\right)}$$

Letting $$\tau_1 = \frac{R_1 R_2 C}{R_1 + R_2}, k_1 = \frac{R_1}{R_1 + R_2} \text{ and } k_2 = \frac{R_2}{R_1 + R_2},:$$

$$v_{o\_1}(s) = \frac{v_{o\_2}(0)}{s + \frac{1}{\tau_1}} - \frac{(V_{sd} - V_f)\frac{k_1}{\tau_1}}{s + \frac{1}{\tau_1}} + \frac{V_{dd}\frac{k_1}{\tau_1}}{s + \frac{1}{\tau_1}}$$

In the time domain:

$$v_{o\_1}(t) = v_{o\_2}(0) e^{\frac{-t}{\tau_1}} + (k_2 V_{dd} - k_1(V_{sd} - V_f))\left(1 - e^{\frac{-t}{\tau_1}}\right)$$

Letting $V_{SS_1} = k_2 V_{dd} - k_1(V_{sd} - V_f)$:

$$v_{o\_1}(t) = v_{o\_2}(0) e^{\frac{-t}{\tau_1}} + V_{SS_1}\left(1 - e^{\frac{-t}{\tau_1}}\right)$$

When the body diode is not conducting then the detection diode D is turned off and reversed biased. Performing Kirchoff's Current Law nodal analysis yields:

$$sCv_{o\_2}(s) - Cv_{o\_1}(T_{bdc}) + \frac{v_{o\_2}(s)}{R_2 + R_3} + \frac{v_{o\_2}(s) - V_{dd}}{R_1} = 0$$

Where $v_{o-2}(s)$ the Laplace domain is function of voltage at $V_{o-}$ and $v_{o-1}(T_{bdc})$ is the initial condition of $V_{o-}$ as the body diode transitions from turning on to turning off. The voltage $v_{o-2}(s)$ is then expressed in the Laplace domain as:

$$v_{o\_2}(s) = \frac{v_{o\_1}(T_{bdc})}{s + \left(\frac{R_1 + R_2 + R_3}{R_1(R_2 + R_3)C}\right)} + \frac{V_{dd}\left(\frac{R_2 + R_3}{R_1 + R_2 + R_3}\right)\left(\frac{R_1 + R_2 + R_3}{R_1(R_2 + R_3)C}\right)}{s + \left(\frac{R_1 + R_2 + R_3}{R_1(R_2 + R_3)C}\right)}$$

Letting $$\tau_2 = \frac{R_1(R_2 + R_3)C}{R_1 + R_2 + R_3}, \quad k_3 = \frac{R_2 + R_3}{R_1 + R_2 + R_3},$$

then:

$$v_{o_e2}(s) = \frac{v_{o\_1}(T_{bdc})}{s + \frac{1}{\tau_2}} + \frac{V_{dd}\frac{k_3}{\tau_2}}{s + \frac{1}{\tau_2}}$$

In the time domain:

$$v_{o\_2}(t) = v_{o\_1}(T_{bdc}) e^{\frac{-(t-T_{bdc})}{\tau_2}} + k_3 V_{dd}\left(1 - e^{\frac{-(t-T_{bdc})}{\tau_2}}\right)$$

Letting $V_{SS_2} = k_3 V_{dd}$ $$v_{o\_2}(t) = v_{o\_1}(T_{bdc}) e^{\frac{-(t-T_{bdc})}{\tau_2}} + V_{SS_2}\left(1 - e^{\frac{-(t-T_{bdc})}{\tau_2}}\right)$$

For a steady state $T_{bdc}$, it should be noted that the initial condition of the voltage at node $V_{o-}$ when the body diode transitions from being on to off is equal at the beginning and end of the period T and can be expressed as $v_{o-2}(0)$ and $v_{o-2}(T)$ $$v_{o\_1}(T_{bdc}) =$$

$$v_{o\_2}(0) e^{\frac{-T_{bdc}}{\tau_1}} + V_{SS_1}\left(1 - e^{\frac{-T_{bdc}}{\tau_1}}\right) = v_{o\_2}(T) e^{\frac{-T_{bdc}}{\tau_1}} + V_{SS_1}\left(1 - e^{\frac{-T_{bdc}}{\tau_1}}\right)$$

$$v_{o\_2}(0) = v_{o\_2}(T) = v_{o\_1}(T_{bdc}) e^{\frac{-(T-T_{bdc})}{\tau_2}} + V_{SS_2}\left(1 - e^{\frac{-(T-T_{bdc})}{\tau_2}}\right)$$

To find the voltage at node $V_{o-}$ as the body diode transitions from being on to off $v_{o-1}(T_{bdc})$ requires the following substitution:

$$v_{o\_1}(T_{bdc}) =$$

$$\left(v_{o\_1}(T_{bdc}) e^{\frac{-(T-T_{bdc})}{\tau_2}} + V_{SS_2}\left(1 - e^{\frac{-(T-T_{bdc})}{\tau_2}}\right)\right) e^{\frac{-T_{bdc}}{\tau_1}} + V_{SS_1}\left(1 - e^{\frac{-T_{bdc}}{\tau_1}}\right)$$

Solving for $v_{o-1}(T_{bdc})$ yields:

$$v_{o\_1}(T_{bdc}) = \frac{V_{SS_2}\left(1 - e^{\frac{-(T-T_{bdc})}{\tau_2}}\right) e^{\frac{-T_{bdc}}{\tau_1}} + V_{SS_1}\left(1 - e^{\frac{-T_{bdc}}{\tau_1}}\right)}{1 - e^{\frac{-(T-T_{bdc})}{\tau_2}} e^{\frac{-T_{bdc}}{\tau_1}}}$$

To solve for the average voltage at node $V_{o-}$, the integrated piecewise linear waveform is divided by the period T.

$$V_{o-} = \frac{1}{T}\left(\int_0^{T_{bdc}} v_{o\_1}(t)dt + \int_{T_{bdc}}^T v_{o\_2}(t)dt\right)$$

$$V_{o-} = \frac{1}{T}\left(\int_0^{T_{bdc}}\left(v_{o\_2}(0) e^{\frac{-t}{\tau_1}} + V_{SS_1}\left(1 - e^{\frac{-t}{\tau_1}}\right)\right)dt + \right.$$

$$\left. \int_{T_{bdc}}^T v_{o\_1}(T_{bdc}) e^{\frac{-(t-T_{bdc})}{\tau_2}} + V_{SS_2}\left(1 - e^{\frac{-(t-T_{bdc})}{\tau_2}}\right)dt\right)$$

$$V_{o-} = \frac{1}{T}\left(\left(-\tau_1 v_{o\_2}(0)\left(e^{\frac{-T_{bdc}}{\tau_1}} - 1\right) + V_{SS_1}\left(T_{bdc} + \tau_1\left(e^{\frac{-T_{bdc}}{\tau_1}} - 1\right)\right)\right) + \right.$$

$$\left(-\tau_2 v_{o\_1}(T_{bdc})\left(e^{\frac{-(T-T_{bdc})}{\tau_2}} - 1\right) + \right.$$

$$\left.\left. V_{SS_2}\left(T - T_{bdc} + \tau_2\left(e^{\frac{-(T-T_{bdc})}{\tau_2}} - 1\right)\right)\right)\right)$$

The $V_{o-}$ node indicates how much time is spent in diode conduction state. It is referenced to the 'nominal' voltage at the $V_{o+}$ node that the $V_{o-}$ node is equal to if there were no body diode conduction. That 'nominal' voltage is created as a reference by $R_4$ and $R_5$. The microcontroller senses the voltage as a differential between $V_{o+}$ node and the $V_{o-}$ node. If there is a differential voltage, it indicates that the body diode in the switch $Q_1$ is conducting. If there is no voltage difference between the two nodes, it indicates that the switch Q1 is not conducting any current through its body diode. The differential voltage between $V_{o+}$ node that the $V_{o-}$ node is equal to:

$$V_o = V_{o+} - V_{o-}$$

$$V_o = V_{dd}\left(\frac{R_5}{R_4 + R_5}\right) - \frac{1}{T}\left(\left(-\tau_1 v_{o\_2}(0)\left(e^{\frac{-T_{bdc}}{\tau_1}} - 1\right) + V_{SS_1}\left(T_{bdc} + \tau_1\left(e^{\frac{-T_{bdc}}{\tau_1}} - 1\right)\right)\right) + \left(-\tau_2 v_{o\_1(T_{bdc})}\left(e^{\frac{-(T-T_{bdc})}{\tau_2}} - 1\right) + V_{SS_2}\left(T - T_{bdc} + \tau_2\left(e^{\frac{-(T-T_{bdc})}{\tau_2}} - 1\right)\right)\right)\right)$$

Selecting resistor values such that $$V_{dd}\left(\frac{R_5}{R_4 + R_5}\right) = V_{SS_2},$$

then $$V_o = V_{SS_2} - \frac{1}{T}\left(\left(-\tau_1 v_{o\_2}(0)\left(e^{\frac{-T_{bdc}}{\tau_1}} - 1\right) + V_{SS_1}\left(T_{bdc} + \tau_1\left(e^{\frac{-T_{bdc}}{\tau_1}} - 1\right)\right)\right) + \left(-\tau_2 v_{o\_1(T_{bdc})}\left(e^{\frac{-(T-T_{bdc})}{\tau_2}} - 1\right) + V_{SS_2}\left(T - T_{bdc} + \tau_2\left(e^{\frac{-(T-T_{bdc})}{\tau_2}} - 1\right)\right)\right)\right)$$

From the above, it can be seen that the differential voltage is a function of the body diode conduction time and is only variable to resistor, capacitor and diode forward voltage values. The values of the resistors, capacitor and diode forward voltage are set in order to maximize the differential voltage from $V_{o-}$ to $V_{o+}$ as a function of body diode conduction time. The offset of the function is 0V when there is no body diode conduction. A microcontroller may use the differential voltage to control the class E duty cycle to a certain amount of body diode conduction, attempting to maintain a certain waveform very close to ideal zero voltage switching but allowing for a little bit of body diode conduction. It may also attempt to change the duty cycle until no differential voltage is measured, indicating that the switch is either at zero voltage or the duty cycle is such that the FET is hard-switching.

In illustrative embodiments, a microcontroller may use the differential voltage to control to a certain extent, the amount of body diode conduction, by adjusting a duty cycle of the switching element. It is understood that a differential signal can be routed to a differential to single ended amplifier instead of a microcontroller to make the signal single-ended and/or to add gain. It may be desirable to maintain some level of body diode conduction.

It may also attempt to change the duty cycle until no differential voltage is measured, indicating that the switch is either zero voltage switching, or the duty cycle is such that the system is hard-switching. It is understood that as used herein soft switching may refer to switching when there is substantially zero voltage across the switch and substantially zero current through the switch.

Figure 6A:
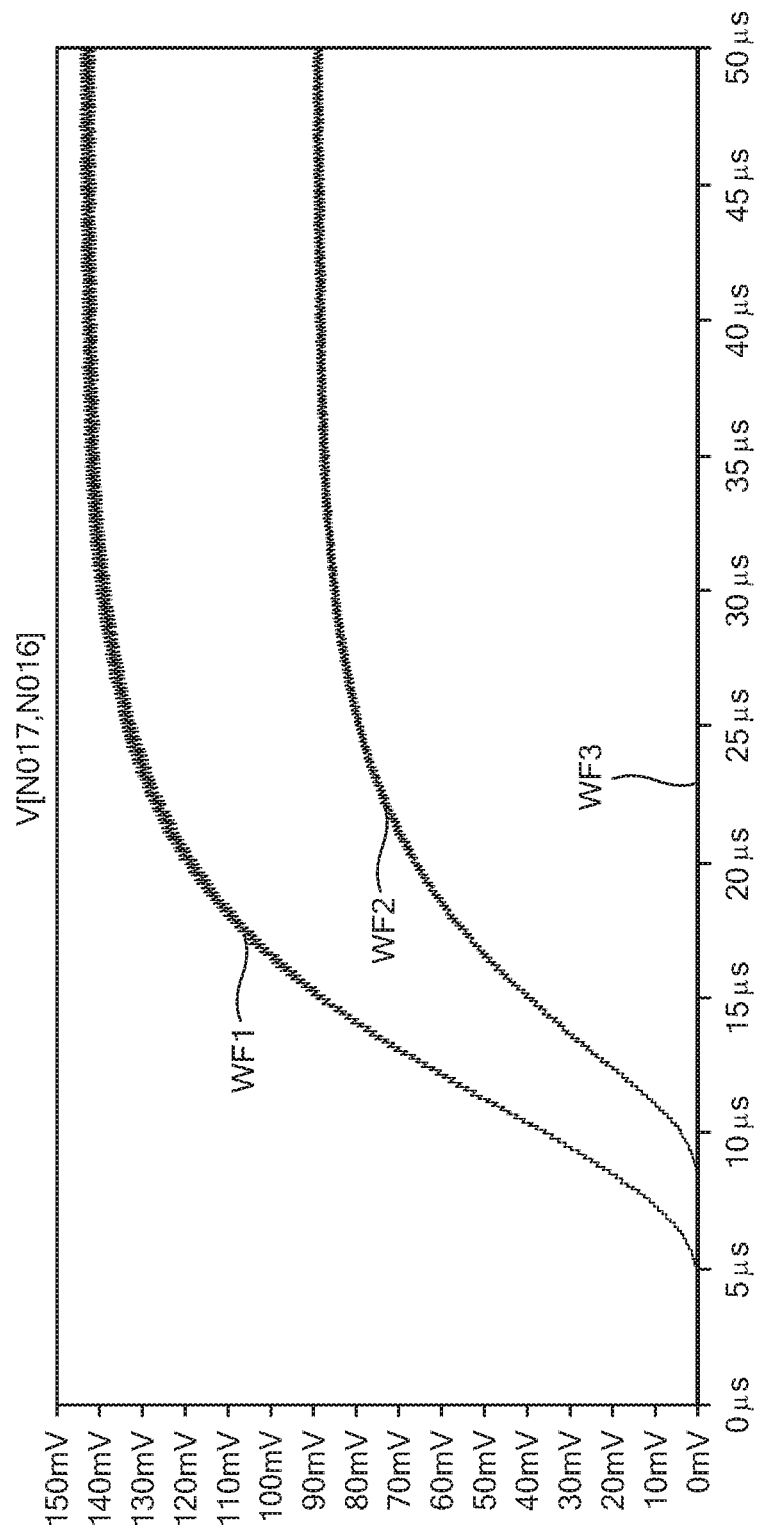
FIG. 6A is a waveform diagram of signals generated by a body diode conduction sensor over varying body diode conduction time.
Figure 6B:
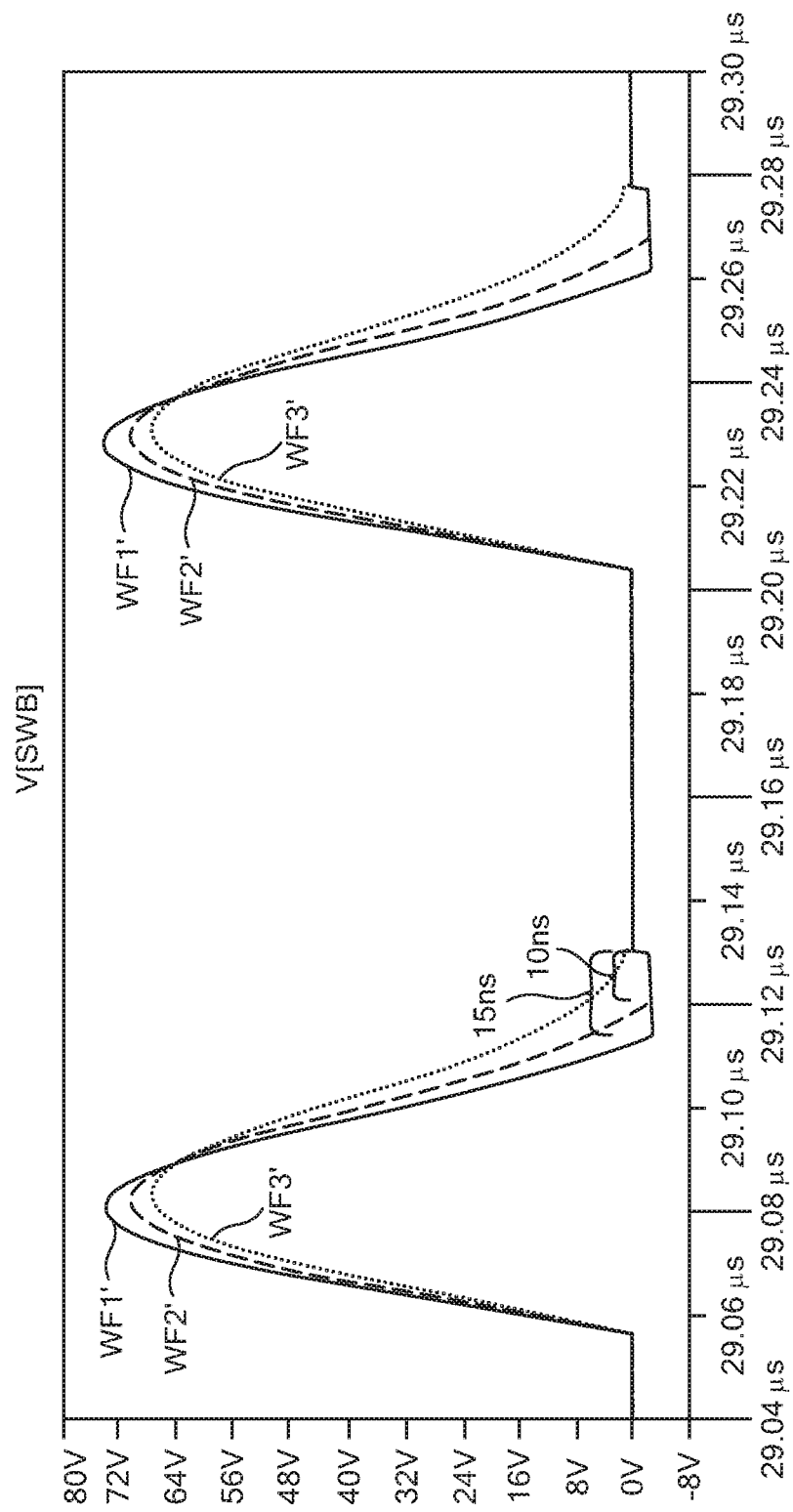
FIG. 6B is a waveform diagram of signals generated by an amplifier over varying load impedance coupled to a body diode conduction sensor.

FIGS. 6A and 6B show example waveforms in form of differential voltages (FIG. 6A) provided by the sensor 500 of FIG. 5 and class E amplifier waveforms at the switching node coupled to the sensor. In FIG. 6A a first waveform WF1 corresponds to reactance in the load of the amplifier such that 15 ns of body diode conduction is occurring in the class E amplifier switch(es). A second waveform WF2 corresponds to reactance in the load of the amplifier such that roughly 10 ns of diode conduction is occurring on the class E amplifier switch(es). A third waveform WF3 coincides with the voltage axis (0 mV) corresponding to no body diode conduction losses in the system. FIG. 6B shows a class E amplifier waveforms WF1', WF2', and WF3' for the same conditions (15 ns of body diode conduction, 10 ns of body diode conduction, and no body diode conduction). As can be seen, body diode conduction of the switching element occurs below 0V across the FET drain to source.

In embodiments, the waveforms above can correspond to various power receiver positions in relation to power transmitters (see FIG. 3). As the power receiver position changes, the loading may change, which can impact the amplifier switching characteristics.

It is understood that the ripple on the differential voltage waveforms WF1, WF2 in FIG. 6A is due to the capacitor C (FIG. 5) charging and discharging each switching cycle, e.g., 6.78 MHz. In order to decrease the ripple, the capacitor C value can be increased. By increasing the value, however, it may dampen the response time that the sensor can be updated. It is understood that increasing the capacitor C will also increase the body diode conduction time to differential voltage gain closer to no body diode conduction time.

Figure 6C:
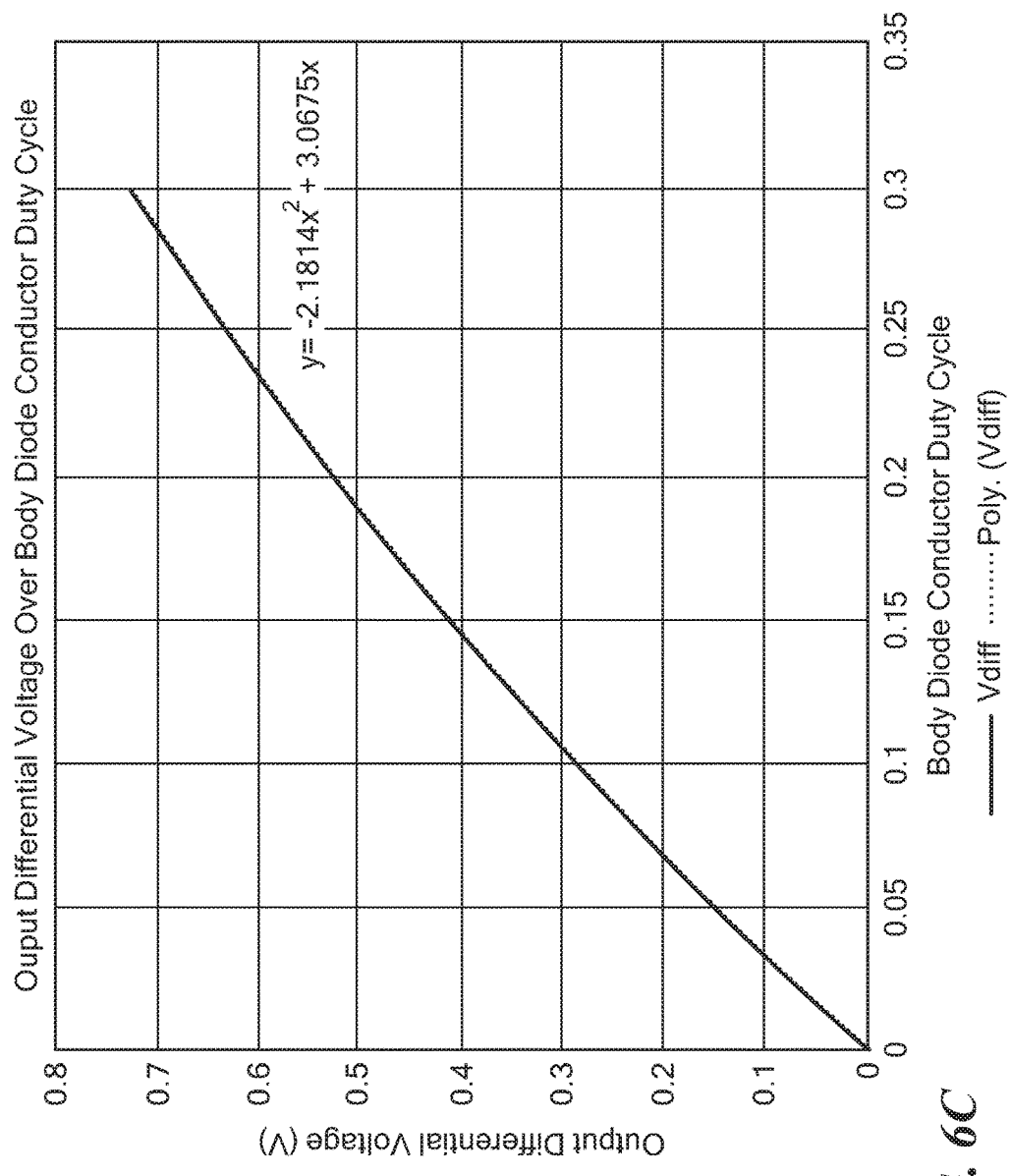
FIG. 6C shows an example graphical representation of the differential voltage from a body diode conduction sensor versus body diode conduction duty cycle.

FIG. 6C shows an example graphical representation of the differential voltage (Vo-, Vo+ FIG. 5) versus body diode conduction duty cycle. As can be seem when there is no body diode conduction (bottom left of curve), the differential voltage is zero. As the body diode conduction duty cycle increases, the differential output voltage detected by the sensor also increases. For example, in one embodiment, as the body diode conduction increases to about 0.3, the differential output voltage detected by the sensor increases to about 0.76V.

In embodiments, a processor receives information from the diode conduction sensor. In embodiments, the differential voltage generated by the sensor is a function of the body diode conduction time. In general, in an ideal case, it is desirable to control the duty cycle of the power switching element to achieve zero voltage switching. In practice, some level of body diode conduction may be desirable to avoid hard switching, for example. In embodiments, a microcontroller may adjust (increase/decrease) the duty cycle of the switching element to maintain a selected level of body diode conduction, which may correspond to a particular body diode conduction time.

Figure 7:
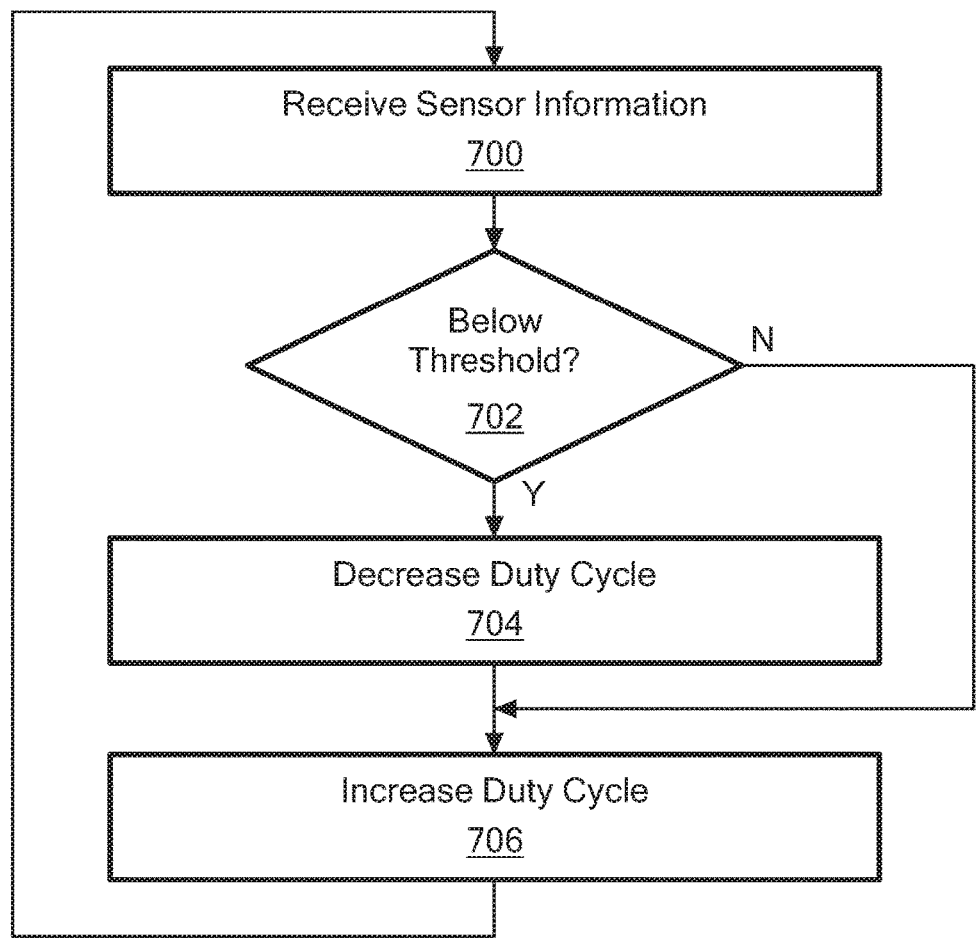
FIG. 7 is a flow diagram showing example processing of information from a body diode conduction sensor.

FIG. 7 shows an illustrative sequence of steps for using feedback from a body diode conduction sensor coupled to a switching element to adjust a duty cycle of the switching element for achieving a selected level of body diode conduction. In step 700, information from the body diode conduction sensor is received, such as at a microcontroller. In step 702, it is determined whether the received sensor information corresponds to an amount of body diode conduction that is below a threshold. For example, the body diode conduction sensor can provide to a processor a positive differential voltage corresponding to an amount of time a body diode spends in a conductive state. In step 704, the duty cycle of the switching element is decreased when the differential voltage, for example, is below the threshold. In step 706, the duty cycle of the switching element is increased when the differential voltage is above the threshold. Processing can continue in step 700 as the body diode conduction sensor continues to send updated information.

It is understood that embodiments of a diode conduction sensor are applicable for amplifiers, converters, and the like, that use switching nodes in order to convert power or signal. Diode conduction sensor embodiments can be used in order to optimize the switching times (or duty cycle) for the converter/amplifier. In other embodiments, active rectification circuit can include a body diode conductor sensor. Optimization of the switching times may result in less time spent in body diode conduction and less time spent in hard-switching for reducing power loss in the power switches and increasing system efficiency. In other embodiments, diode conduction sensors can determine operating points of the system. The sensor information, augmented with additional sensors, may be used to determine an impedance seen downstream of the amplifier/converter and may help with power loss information, impedance detection, etc., and may be used as a means of dynamic impedance control and/or may be used as a means of determining power loss information in the system.

Figure 8:
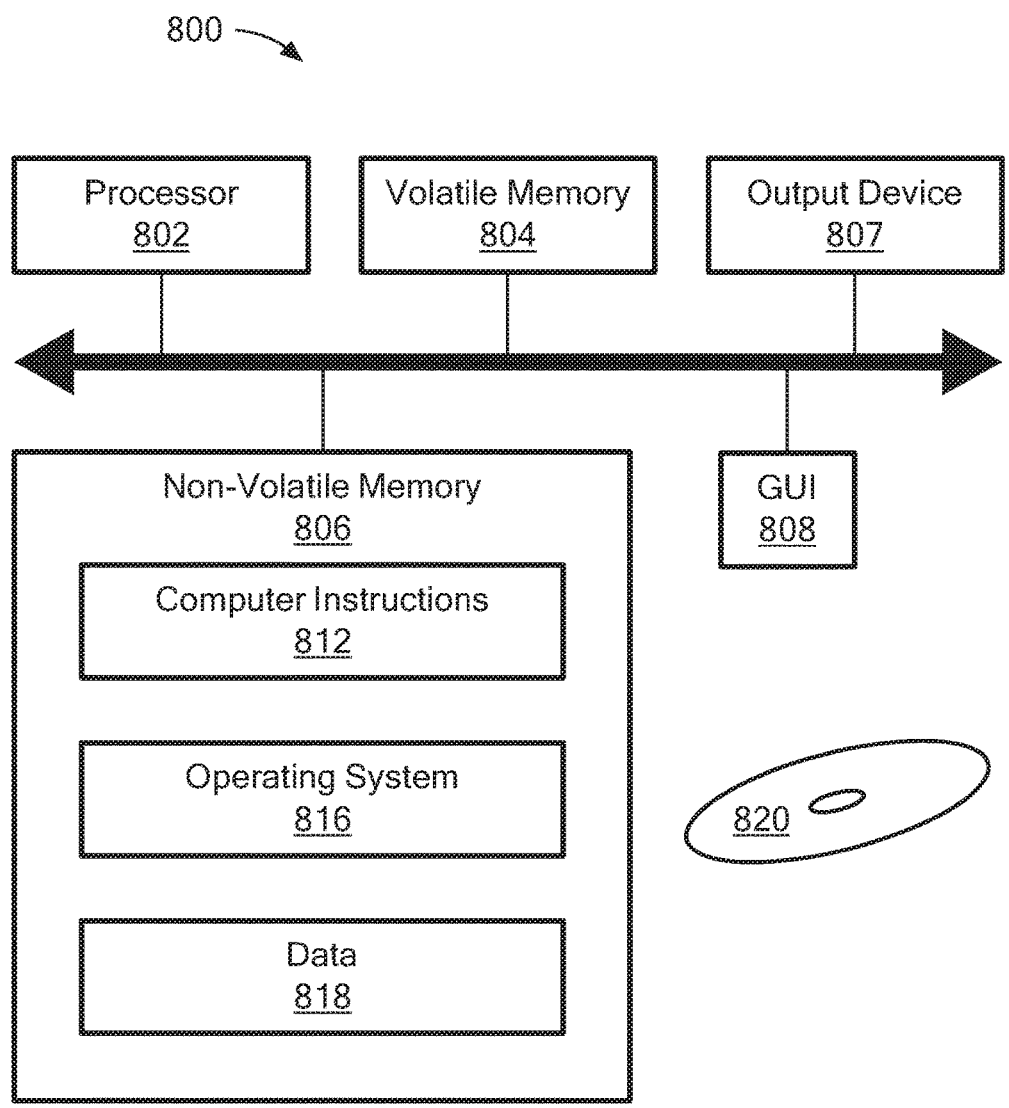
FIG. 8 shows a schematic representation of an illustrative computer that can perform at least a portion of the processing described herein.

FIG. 8 shows an exemplary computer 800 that can perform at least part of the processing described herein. The computer 800 includes a processor 802, a volatile memory 804, a non-volatile memory 806 (e.g., hard disk), an output device 807 and a graphical user interface (GUI) 808 (e.g., a mouse, a keyboard, a display, for example). The non-volatile memory 806 stores computer instructions 812, an operating system 816 and data 818. In one example, the computer instructions 812 are executed by the processor 802 out of volatile memory 804. In one embodiment, an article 820 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A system, comprising:
a body diode conduction sensor configured for coupling to a switching element, the sensor comprising:
first and second voltage divider networks coupled to a voltage source;
a detection diode coupled to the switching element and to the first voltage divider network, wherein the detection diode is conductive at times corresponding to body diode conduction of the switching element decreasing a DC average voltage at an output node of the first voltage divider network; and
an output for a differential output voltage coupled to the first and second voltage divider networks having an output signal corresponding to a time of the body diode conduction of the switching element.

2. The system according to claim 1, further including a shunt capacitor coupled across the switching element.

3. The system according to claim 1, wherein a duty cycle of the switching element is adjusted based upon the body diode conduction of the switching element.

4. The system according to claim 1, wherein the switching element forms a part of a class E amplifier.

5. The system according to claim 1, wherein the sensor comprises a part of a power transmitter to transmit wireless power to a power receiver.

6. The system according to claim 5, wherein the power transmitter comprises a resonant wireless power transmitter.

7. The system according to claim 6, wherein the power transmitter includes an impedance matching network driven by the switching element.

8. A method, comprising:
providing a body diode conduction sensor configured for coupling to a switching element by:
coupling first and second voltage divider networks to a voltage source;
coupling a detection diode to the switching element and to the first voltage divider network, wherein the detection diode is conductive at times corresponding to body diode conduction of the switching element decreasing a DC average voltage at an output node of the first voltage divider network; and
coupling an output for a differential output voltage to the first and second voltage divider networks having an output signal corresponding to a time of the body diode conduction of the switching element.

9. The method according to claim 8, further including coupling a shunt capacitor across the switching element.

10. The method according to claim 8, wherein a duty cycle of the switching element is adjusted based upon the body diode conduction of the switching element.

11. The method according to claim 8, wherein the switching element forms a part of a class E amplifier.

12. The method according to claim 8, wherein the sensor comprises a part of a power transmitter to transmit wireless power to a power receiver.

13. The method according to claim 12, wherein the power transmitter comprises a resonant wireless power transmitter.

14. The method according to claim 13, wherein the power transmitter includes an impedance matching network driven by the switching element.

15. A body diode conduction sensor, comprising:
- a divider means for dividing voltage coupled to a voltage source;
- a detection diode coupled to a switching means and to the divider means, wherein the detection diode is conductive at times corresponding to body diode conduction of the switching means decreasing a DC average voltage at an output node of the first voltage divider network; and
- a differential output voltage means coupled to the divider means, the differential output voltage means having an output signal corresponding to a time of the body diode conduction of the switching element.

16. The sensor according to claim 15, further including a shunt element coupled across the switching means.

17. The sensor according to claim 15, wherein a duty cycle of the switching means is adjusted based upon the body diode conduction of the switching means.

18. The sensor according to claim 15, wherein the switching means forms a part of a class E amplifier.

19. The sensor according to claim 15, wherein the sensor comprises a part of a power transmitter to transmit wireless power to a power receiver.

20. The sensor according to claim 19, wherein the power transmitter comprises a resonant wireless power transmitter.

* * * * *